(12) United States Patent
Martinez et al.

(10) Patent No.: US 9,521,023 B2
(45) Date of Patent: Dec. 13, 2016

(54) SYSTEMS FOR ANALOG PHASE SHIFTING

(71) Applicant: Kumu Networks, Inc., Sunnyvale, CA (US)

(72) Inventors: Ricardo Martinez, Sunnyvale, CA (US); Joseph Shalizi, Sunnyvale, CA (US); Ernie Landi, Sunnyvale, CA (US); Mayank Jain, Sunnyvale, CA (US); Jung-Il Choi, Sunnyvale, CA (US)

(73) Assignee: Kumu Networks, Inc., Sunnyvale, CA (US)

( * ) Notice: Subject to any disclaimer, the term of this patent is extended or adjusted under 35 U.S.C. 154(b) by 0 days.

(21) Appl. No.: 14/887,198

(22) Filed: Oct. 19, 2015

(65) Prior Publication Data

US 2016/0112226 A1   Apr. 21, 2016

Related U.S. Application Data

(60) Provisional application No. 62/065,583, filed on Oct. 17, 2014.

(51) Int. Cl.
| | |
|---|---|
| *H04B 1/10* | (2006.01) |
| *H04L 27/20* | (2006.01) |
| *H03C 3/12* | (2006.01) |
| *H04B 1/525* | (2015.01) |
| *H01Q 3/36* | (2006.01) |
| *H04B 7/155* | (2006.01) |

(52) U.S. Cl.
CPC ............. *H04L 27/2003* (2013.01); *H03C 3/12* (2013.01); *H01Q 3/36* (2013.01); *H04B 1/10* (2013.01); *H04B 1/525* (2013.01); *H04B 7/15585* (2013.01)

(58) Field of Classification Search
CPC ....... H04B 1/10; H04B 1/525; H04B 7/15585; H01Q 3/36
USPC ........ 455/120, 121, 122, 123, 124, 125, 296
See application file for complete search history.

(56) References Cited

U.S. PATENT DOCUMENTS

| | | | |
|---|---|---|---|
| 4,321,624 | A | 3/1982 | Gibson et al. |
| 4,952,193 | A | 8/1990 | Talwar |
| 5,212,827 | A | 5/1993 | Meszko et al. |
| 5,691,978 | A | 11/1997 | Kenworthy |

(Continued)

FOREIGN PATENT DOCUMENTS

| | | |
|---|---|---|
| EP | 0755141 B1 | 10/2005 |
| EP | 1959625 B1 | 2/2009 |

(Continued)

OTHER PUBLICATIONS

Bharadia et al., "Full Duplex Radios" SIGOMM, Aug. 12-16, 2013, Hong Kong, China, Copyright 2013 ACM 978-1-4503-2056-6/6/13/08, 12 pages.

*Primary Examiner* — Duc M Nguyen
(74) *Attorney, Agent, or Firm* — Jeffrey Schox; Thomas Gwinn (57) ABSTRACT

A system for phase shifting that produces an output signal by modifying a phase of an input signal, including a primary phase shifting stage that modifies the input signal phase in increments set by a first tuning resolution; a secondary phase shifting stage that modifies the input signal phase in increments set by a second tuning resolution; and, a tuning circuit that controls the primary phase shifting stage and the secondary phase shifting stage according to control input.

18 Claims, 11 Drawing Sheets

(56) References Cited

U.S. PATENT DOCUMENTS

| | | | |
|---|---|---|---|
| 5,734,967 A | 3/1998 | Kotzin et al. | |
| 5,790,658 A | 8/1998 | Yip et al. | |
| 5,818,385 A * | 10/1998 | Bartholomew | H01Q 1/246 342/372 |
| 5,930,301 A | 7/1999 | Chester et al. | |
| 6,215,812 B1 | 4/2001 | Young et al. | |
| 6,240,150 B1 | 5/2001 | Darveau et al. | |
| 6,411,250 B1 | 6/2002 | Oswald et al. | |
| 6,539,204 B1 * | 3/2003 | Marsh | H04B 1/123 455/296 |
| 6,567,649 B2 | 5/2003 | Souissi | |
| 6,639,551 B2 | 10/2003 | Li et al. | |
| 6,657,950 B1 | 12/2003 | Jones et al. | |
| 6,725,017 B2 | 4/2004 | Blount et al. | |
| 6,965,657 B1 | 11/2005 | Rezvani et al. | |
| 7,336,940 B2 | 2/2008 | Smithson | |
| 7,349,505 B2 | 3/2008 | Blount et al. | |
| 7,362,257 B2 | 4/2008 | Bruzzone et al. | |
| 7,426,242 B2 | 9/2008 | Thesling | |
| 7,509,100 B2 * | 3/2009 | Toncich | G01R 27/2694 330/302 |
| 7,869,527 B2 | 1/2011 | Vetter et al. | |
| 8,027,642 B2 * | 9/2011 | Proctor, Jr. | H04B 7/15585 370/279 |
| 8,055,235 B1 | 11/2011 | Gupta et al. | |
| 8,060,803 B2 | 11/2011 | Kim | |
| 8,086,191 B2 | 12/2011 | Fukuda et al. | |
| 8,155,595 B2 | 4/2012 | Sahin et al. | |
| 8,175,535 B2 | 5/2012 | Mu | |
| 8,179,990 B2 | 5/2012 | Orlik et al. | |
| 8,218,697 B2 | 7/2012 | Guess et al. | |
| 8,331,477 B2 | 12/2012 | Huang et al. | |
| 8,351,533 B2 | 1/2013 | Shrivastava et al. | |
| 8,385,871 B2 | 2/2013 | Wyville | |
| 8,422,540 B1 | 4/2013 | Negus et al. | |
| 8,995,410 B2 | 3/2015 | Balan et al. | |
| 9,019,849 B2 | 4/2015 | Hui et al. | |
| 9,042,838 B2 | 5/2015 | Braithwaite | |
| 9,054,795 B2 * | 6/2015 | Choi | H04B 1/525 |
| 9,124,475 B2 | 9/2015 | Li et al. | |
| 9,184,902 B2 | 11/2015 | Khojastepour et al. | |
| 9,312,895 B1 * | 4/2016 | Gupta | H04B 1/109 |
| 2002/0034191 A1 | 3/2002 | Shattil | |
| 2002/0064245 A1 | 5/2002 | McCorkle | |
| 2002/0172265 A1 | 11/2002 | Kenney | |
| 2003/0031279 A1 | 2/2003 | Blount et al. | |
| 2003/0099287 A1 | 5/2003 | Arambepola | |
| 2003/0104787 A1 | 6/2003 | Blount et al. | |
| 2003/0148748 A1 | 8/2003 | Shah | |
| 2004/0106381 A1 | 6/2004 | Tiller | |
| 2004/0266378 A1 * | 12/2004 | Fukamachi | H03H 7/0115 455/188.1 |
| 2005/0078743 A1 | 4/2005 | Shohara | |
| 2005/0129152 A1 | 6/2005 | Hillstrom | |
| 2005/0159128 A1 | 7/2005 | Collins et al. | |
| 2005/0190870 A1 | 9/2005 | Blount et al. | |
| 2005/0250466 A1 | 11/2005 | Varma et al. | |
| 2005/0254555 A1 | 11/2005 | Teague | |
| 2005/0282500 A1 | 12/2005 | Wang et al. | |
| 2006/0030277 A1 | 2/2006 | Cyr et al. | |
| 2006/0058022 A1 | 3/2006 | Webster et al. | |
| 2006/0209754 A1 | 9/2006 | Ji et al. | |
| 2006/0273853 A1 | 12/2006 | Suzuki et al. | |
| 2007/0018722 A1 | 1/2007 | Jaenecke | |
| 2007/0249314 A1 | 10/2007 | Sanders et al. | |
| 2007/0274372 A1 | 11/2007 | Asai et al. | |
| 2008/0037801 A1 | 2/2008 | Alves et al. | |
| 2008/0107046 A1 | 5/2008 | Kangasmaa et al. | |
| 2008/0111754 A1 * | 5/2008 | Osterhues | H01Q 21/064 343/778 |
| 2008/0131133 A1 | 6/2008 | Blunt et al. | |
| 2008/0192636 A1 | 8/2008 | Briscoe et al. | |
| 2008/0219377 A1 | 9/2008 | Nisbet | |
| 2009/0022089 A1 | 1/2009 | Rudrapatna | |
| 2009/0034437 A1 | 2/2009 | Shin et al. | |
| 2009/0047914 A1 | 2/2009 | Axness et al. | |
| 2009/0180404 A1 | 7/2009 | Jung et al. | |
| 2009/0186582 A1 | 7/2009 | Muhammad et al. | |
| 2009/0303908 A1 | 12/2009 | Deb et al. | |
| 2010/0014600 A1 | 1/2010 | Li et al. | |
| 2010/0014614 A1 | 1/2010 | Leach et al. | |
| 2010/0022201 A1 | 1/2010 | Vandenameele | |
| 2010/0056166 A1 | 3/2010 | Tenny | |
| 2010/0117693 A1 | 5/2010 | Lorg et al. | |
| 2010/0136900 A1 | 6/2010 | Seki | |
| 2010/0150033 A1 | 6/2010 | Zinser et al. | |
| 2010/0150070 A1 * | 6/2010 | Park | G01S 5/0027 370/328 |
| 2010/0159858 A1 | 6/2010 | Dent et al. | |
| 2010/0215124 A1 | 8/2010 | Zeong et al. | |
| 2010/0226416 A1 | 9/2010 | Dent et al. | |
| 2010/0226448 A1 | 9/2010 | Dent | |
| 2010/0232324 A1 | 9/2010 | Radunovic et al. | |
| 2010/0279602 A1 | 11/2010 | Larsson et al. | |
| 2010/0295716 A1 | 11/2010 | Yamaki et al. | |
| 2011/0013684 A1 | 1/2011 | Semenov et al. | |
| 2011/0081880 A1 | 4/2011 | Ahn | |
| 2011/0149714 A1 | 6/2011 | Rimini et al. | |
| 2011/0216813 A1 | 9/2011 | Baldemair et al. | |
| 2011/0222631 A1 | 9/2011 | Jong | |
| 2011/0243202 A1 | 10/2011 | Lakkis | |
| 2011/0250858 A1 | 10/2011 | Jain et al. | |
| 2011/0254639 A1 * | 10/2011 | Tsutsumi | H01P 1/213 333/132 |
| 2011/0256857 A1 | 10/2011 | Chen et al. | |
| 2011/0268232 A1 | 11/2011 | Park et al. | |
| 2011/0311067 A1 | 12/2011 | Harris et al. | |
| 2011/0319044 A1 | 12/2011 | Bornazyan | |
| 2012/0021153 A1 | 1/2012 | Bhandari et al. | |
| 2012/0063369 A1 | 3/2012 | Lin et al. | |
| 2012/0063373 A1 | 3/2012 | Chincholi et al. | |
| 2012/0140685 A1 | 6/2012 | Lederer et al. | |
| 2012/0147790 A1 | 6/2012 | Khojastepour et al. | |
| 2012/0154249 A1 | 6/2012 | Khojastepour et al. | |
| 2012/0155335 A1 | 6/2012 | Khojastepour et al. | |
| 2012/0155336 A1 | 6/2012 | Khojastepour et al. | |
| 2012/0201153 A1 | 8/2012 | Bharadia et al. | |
| 2012/0201173 A1 | 8/2012 | Jain et al. | |
| 2012/0224497 A1 | 9/2012 | Lindoff et al. | |
| 2013/0005284 A1 | 1/2013 | Dalipi | |
| 2013/0044791 A1 | 2/2013 | Rimini et al. | |
| 2013/0089009 A1 | 4/2013 | Li et al. | |
| 2013/0102254 A1 * | 4/2013 | Cyzs | H04B 1/126 455/63.1 |
| 2013/0155913 A1 | 6/2013 | Sarca | |
| 2013/0166259 A1 | 6/2013 | Weber et al. | |
| 2013/0194984 A1 | 8/2013 | Cheng et al. | |
| 2013/0215805 A1 | 8/2013 | Hong et al. | |
| 2013/0225101 A1 | 8/2013 | Basaran et al. | |
| 2013/0253917 A1 | 9/2013 | Schildbach | |
| 2013/0259343 A1 | 10/2013 | Liu et al. | |
| 2013/0301487 A1 | 11/2013 | Khandani | |
| 2013/0301488 A1 | 11/2013 | Hong et al. | |
| 2013/0308717 A1 * | 11/2013 | Maltsev | H04B 7/0417 375/267 |
| 2014/0011461 A1 * | 1/2014 | Bakalski | H04B 1/3805 455/78 |
| 2014/0126437 A1 | 5/2014 | Patil et al. | |
| 2014/0169236 A1 | 6/2014 | Choi et al. | |
| 2014/0185533 A1 | 7/2014 | Haub | |
| 2014/0206300 A1 | 7/2014 | Hahn et al. | |
| 2014/0219139 A1 | 8/2014 | Choi et al. | |
| 2014/0219449 A1 | 8/2014 | Shattil et al. | |
| 2014/0348018 A1 | 11/2014 | Bharadia et al. | |
| 2014/0348032 A1 | 11/2014 | Hua et al. | |
| 2014/0376416 A1 * | 12/2014 | Choi | H04B 3/23 370/277 |
| 2015/0156003 A1 | 6/2015 | Khandani | |
| 2015/0156004 A1 | 6/2015 | Khandani | |

(56) References Cited

U.S. PATENT DOCUMENTS

2015/0249444 A1* 9/2015 Shin ................ H03F 3/211
                                                    327/161
2015/0303984 A1  10/2015 Braithwaite

FOREIGN PATENT DOCUMENTS

| EP | 2267946 A2 | 12/2010 |
| RU | 2256985 C2 | 7/2005 |
| WO | 2013173250 A1 | 11/2013 |
| WO | 2013185106 A1 | 12/2013 |
| WO | 2014093916 A1 | 6/2014 |

* cited by examiner

SYSTEMS FOR ANALOG PHASE SHIFTING

CROSS-REFERENCE TO RELATED APPLICATIONS

This application claims the benefit of U.S. Provisional Application Ser. No. 62/065,583, filed on 17 Oct. 2014, which is incorporated in its entirety by this reference.

TECHNICAL FIELD

This invention relates generally to the wireless communications field, and more specifically to new and useful systems for analog phase shifting.

BACKGROUND

Traditional wireless communication systems are half-duplex; that is, they are not capable of transmitting and receiving signals simultaneously on a single wireless communications channel. Recent work in the wireless communications field has led to advancements in developing full-duplex wireless communications systems; these systems, if implemented successfully, could provide enormous benefit to the wireless communications field. For example, the use of full-duplex communications by cellular networks could cut spectrum needs in half. One major roadblock to successful implementation of full-duplex communications is the problem of self-interference.

Many solutions to address self-interference rely on phase shifting circuits (e.g., as part of an analog self-interference canceller), but these solutions may suffer in performance due to constraints inherent in traditional phase shifting circuits. Thus, there is a need in the wireless communications field to create new and useful systems for analog phase shifting. This invention provides such new and useful systems.

Of course, such systems for analog phase shifting may find use in a wide variety of applications; for example, phased antenna arrays or any other beam-steering application.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. Full-Duplex Wireless Communication Systems

Wireless communications systems have revolutionized the way the world communicates, and the rapid growth of communication using such systems has provided increased economic and educational opportunity across all regions and industries. Unfortunately, the wireless spectrum required for communication is a finite resource, and the rapid growth in wireless communications has also made the availability of this resource ever scarcer. As a result, spectral efficiency has become increasingly important to wireless communications systems.

One promising solution for increasing spectral efficiency is found in full-duplex wireless communications systems; that is, wireless communications systems that are able to transmit and receive wireless signals at the same time on the same wireless channel. This technology allows for a doubling of spectral efficiency compared to standard half-duplex wireless communications systems.

While full-duplex wireless communications systems have substantial value to the wireless communications field, such systems have been known to face challenges due to self-interference; because reception and transmission occur at the same time on the same channel, the received signal at a full-duplex transceiver may include undesired signal components from the signal being transmitted from that transceiver. As a result, full-duplex wireless communications systems often include analog and/or digital self-interference cancellation circuits to reduce self-interference.

Full-duplex transceivers preferably sample transmission output as baseband digital signals, intermediate frequency (IF) analog signals, or as radio-frequency (RF) analog signals, but full-duplex transceivers may additionally or alternatively sample transmission output in any suitable manner (e.g., as IF digital signals). This sampled transmission output may be used by full-duplex transceivers to remove interference from received wireless communications data (e.g., as RF/IF analog signals or baseband digital signals). In many full-duplex transceivers, an analog self-interference cancellation system is paired with a digital self-interference cancellation system. The analog self-interference cancellation system removes a first portion of self-interference by summing delayed, phase shifted and scaled versions of the RF transmit signal to create an RF self-interference cancellation signal, which is then subtracted from the RF receive signal. Alternatively, the analog cancellation system may perform similar tasks at an intermediate frequency. After the RF (or IF) receive signal has the RF/IF self-interference cancellation signal subtracted, it passes through an analog-to-digital converter of the receiver (and becomes a digital receive signal). After this stage, a digital self-interference cancellation signal (created by transforming a digital transmit signal) is then subtracted from the digital receive signal.

Figure 1:
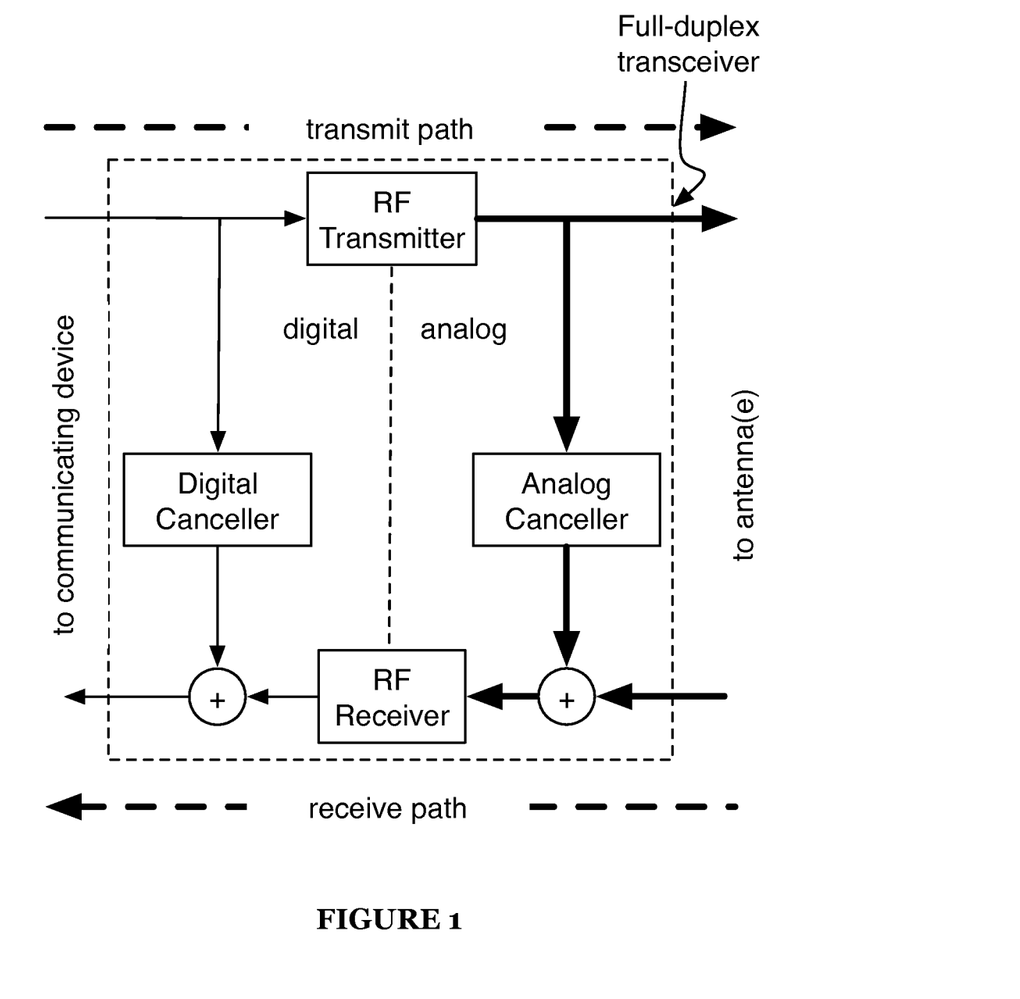
FIG. 1 is a schematic representation of a full-duplex transceiver.

The systems described herein may increase performance of full-duplex transceivers as shown in FIG. 1 (and other applicable systems) by enabling high accuracy phase shifting without prohibitive increases in circuit complexity and/or cost. Other applicable systems include active sensing systems (e.g., RADAR), wired communications systems, wireless communications systems, channel emulators, reflectometers, PIM analyzers and/or any other suitable system, including communication systems where transmit and receive bands are close in frequency, but not overlapping.

2. System for Analog Phase Shifting

Figure 2:
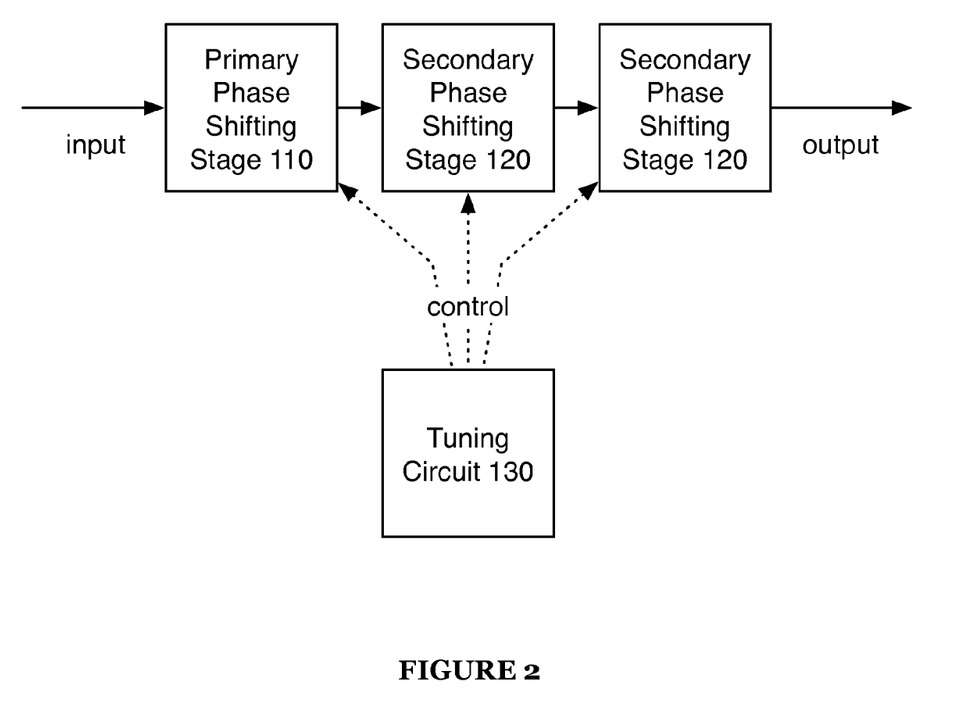
FIG. 2 is a schematic representation of a system of a preferred embodiment.

As shown in FIG. 2, a system 100 for analog phase shifting includes a primary phase shifting stage 110, a secondary phase shifting stage 120, and a tuning circuit 130. The system 100 may additionally or alternatively include any number of phase shifting stages 110 or 120. For example, the system 100 may include only a single primary phase shifting stage 110. As another example, the system 100 may include multiple primary phase shifting stages 110 and multiple secondary phase shifting stages 120.

The distinction between the primary phase shifting stage 110 and the secondary phase shifting stage 120 is that the resolution of phase shifting performed by the secondary phase shifting stage 120 is higher than the resolution of the phase shifting stage 110. Resultantly, a phase shifting stage may be a primary phase shifting stage in one architecture, but a secondary phase shifting stage in another. The use of the terms primary and secondary are intended to clarify differing functions of phase shifting stages in a given architecture including multiple phase shifting stages with differing phase shift resolutions, though a person of ordinary skill in the art will recognize that such an architecture is only one of many system 100 architectures possible.

The system 100 functions to increase the performance of full-duplex transceivers (or other applicable systems; e.g., phased antenna arrays) by enabling high accuracy phase shifting without prohibitive increases in circuit complexity and/or cost.

The system 100 is preferably implemented using analog circuitry, but additionally or alternatively may be implemented by digital circuitry or any combination of analog and digital circuitry. Analog circuitry is preferably implemented using analog integrated circuits (ICs) but may additionally or alternatively be implemented using discrete components (e.g., capacitors, inductors, resistors, transistors), wires, transmission lines, transformers, couplers, hybrids, waveguides, digital components, mixed-signal components, or any other suitable components. Digital circuitry is preferably implemented using a general-purpose processor, a digital signal processor, an application specific integrated circuit (ASIC), a field programmable gate array (FPGA) and/or any suitable processor(s) or circuit(s). The system 100 preferably includes memory to store configuration data, but may additionally or alternatively be configured using externally stored configuration data or in any suitable manner.

The primary phase shifting stage 110 functions to enable phase shifting by the system 100. If the system 100 includes multiple phase shifting stages, the primary phase shifting stage 110 provides the lowest level of phase shift resolution (i.e., the coarsest adjustment of phase) in the system 100.

The primary phase shifting stage 110 is preferably optimized to reduce the number of components required in phase shifter construction (and therefore also circuit complexity/cost) as well as to provide low insertion loss.

In the case of system 100 implementation in a self-interference cancellation system, the primary phase shifting stage 110 may be used to shift the phase of one or more signal paths in an analog self-interference cancellation circuit, in turn allowing the self-interference cancellation signal generated by the self-interference cancellation circuit to reflect the contributions of multiple signal components with offset phases.

Figure 3:
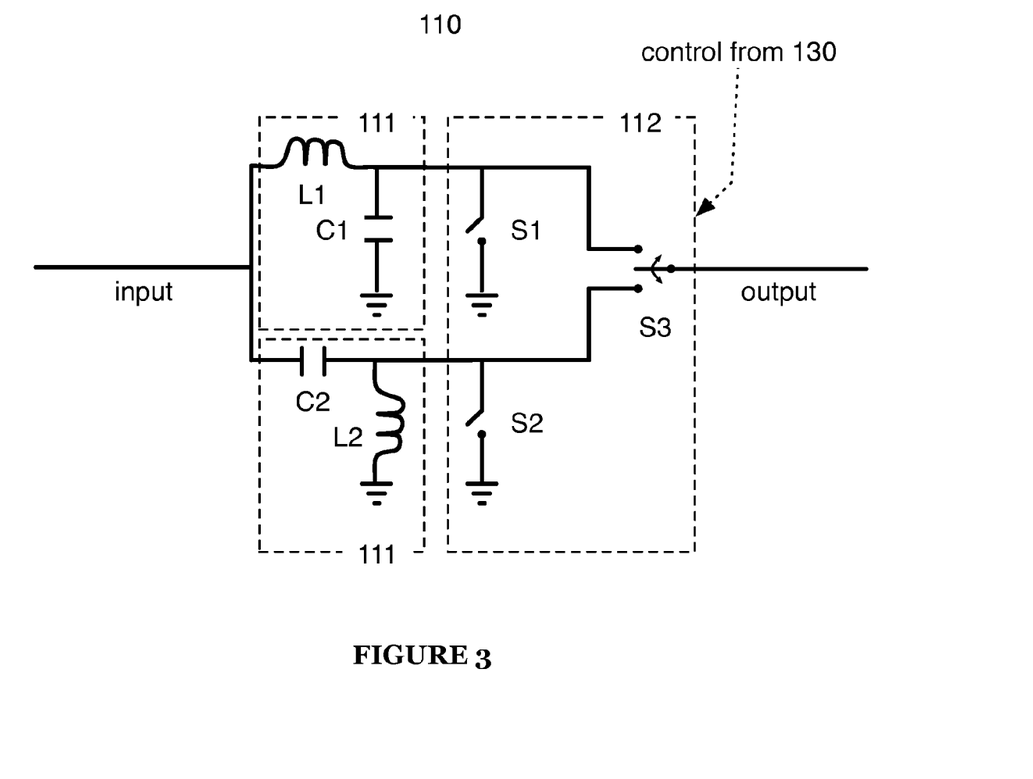
FIG. 3 is a schematic representation of a primary phase shifting stage of a system of a preferred embodiment.
Figure 4A:
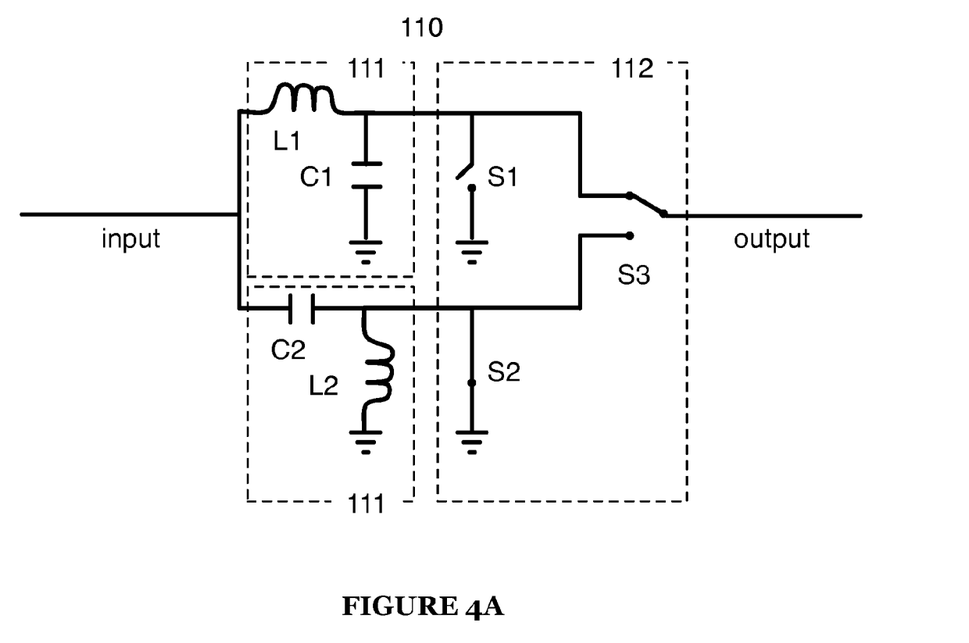
FIG. 4A is a schematic representation of a primary phase shifting stage of a system of a preferred embodiment.
Figure 5A:
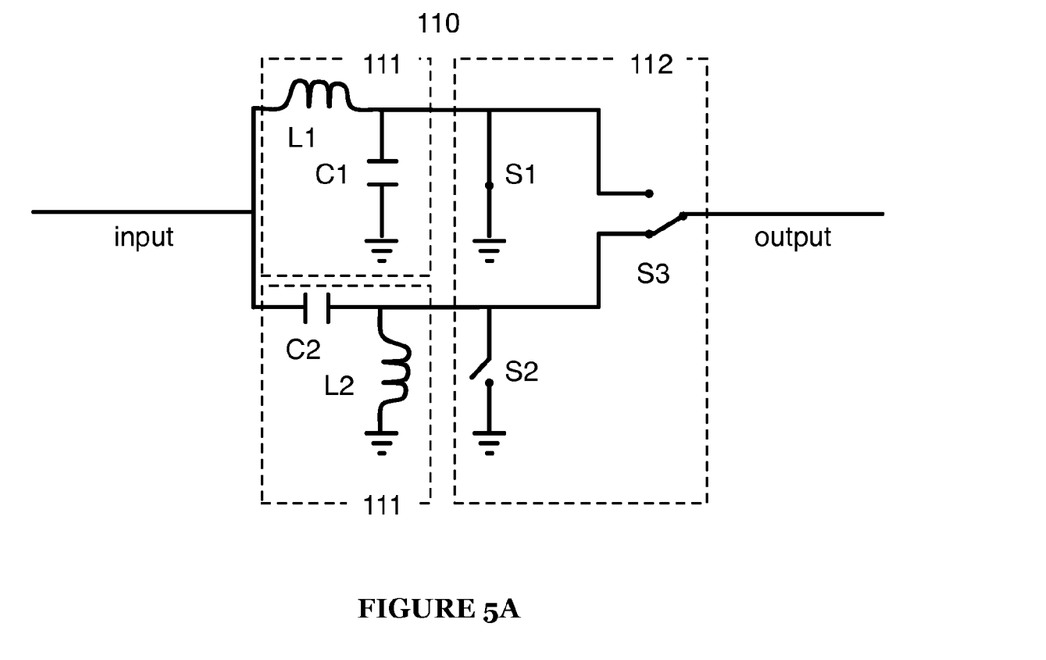
FIG. 5A is a schematic representation of a primary phase shifting stage of a system of a preferred embodiment.

In one implementation, the primary phase shifting stage 110 includes multiple switched sub-circuits 111 and a set of switches 112, as shown in FIG. 3. Each sub-circuit 111 is preferably coupled to ground via a switch of the set of switches 112; each sub-circuit 111 is preferably also coupled to the output of the primary phase shifting stage 110 via another switch of the set of switches 112. In this implementation, the primary phase shifting stage 110 preferably includes two sub-circuits 111, but may additionally or alternatively include any number of sub-circuits 111. In operation of the primary phase shifting stage, one sub-circuit 111 is coupled to the stage 110 output via the set of switches 112 while the other sub-circuits 111 are coupled to ground (or to another common rail). In the case of a two-sub-circuit 111 implementation, this results in two primary operating states: a first state where S1 (i.e., the switch coupling a first sub-circuit 111 to ground) is open, S2 (i.e., the switch coupling a second sub-circuit 111 to ground) is closed, and S3 (i.e., the switch coupling the stage output to one of the two sub-circuit 111 outputs) couples the stage output to the first sub-circuit 111 output, as shown in FIG. 4A; and a second state where S1 is closed, S2 is open, and S3 couples the stage output to the second sub-circuit 111 output, as shown in FIG. 5A. Note that in both of these primary operating states, the operation of the phase shifting stage 110 is dependent not only on the switch configuration, but also on both sub-circuits 111 (i.e., the grounded sub-circuit 111 contributes to the response of the stage). This is distinct from a set of switched sub-circuits in which only one sub-circuit contributes to the response of the set at a time. Note that while the phase shifting stage 110 preferably operates in one of the primary operating states, the phase shifting stage 110 may additionally or alternatively operate in any state (e.g., both of S1 and S2 open).

Figure 4B:
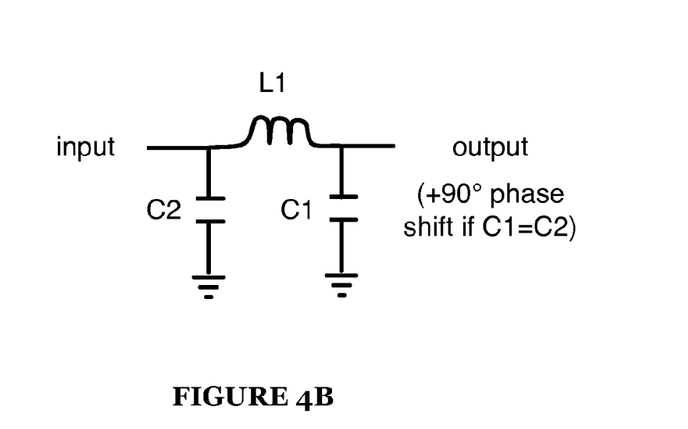
FIG. 4B is an equivalent circuit schematic representation of a primary phase shifting stage of a system of a preferred embodiment.
Figure 5B:
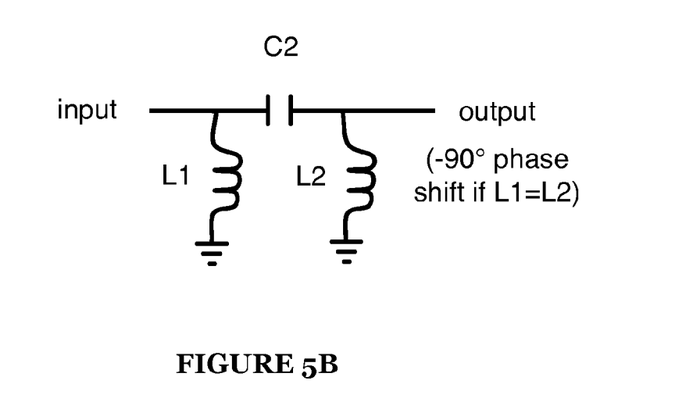
FIG. 5B is an equivalent circuit schematic representation of a primary phase shifting stage of a system of a preferred embodiment.

Each sub-circuit 111 functions to contribute to a set of overall desired phase shifting architectures. The sub-circuits 111 may comprise any analog or digital circuit components in any configuration. In one example of this implementation, one sub-circuit 111 may comprise an LC low-pass filter (e.g., the sub-circuit 111 coupled to S1 as shown in FIGS. 4A and 5A) and another sub-circuit 111 may comprise an LC high-pass filter (e.g., the sub-circuit 111 coupled to S2 as shown in FIGS. 4A and 5A). When in the first state (S1 open, S2 closed, S3 coupled to first sub-circuit 111), the primary phase shifting stage 110 may be represented by an equivalent CLC pi-circuit, as shown in FIG. 4B. By appropriately setting inductor and capacitor values, such a circuit could serve as a +90 degree phase shifter. When in the second state (S1 closed, S2 open, S3 coupled to second sub-circuit 111), the primary phase shifting stage 110 may be represented by an equivalent LCL pi-circuit, as shown in FIG. 5B. By appropriately setting inductor and capacitor values, such a circuit could serve as a −90 degree phase shifter. In this manner, a primary phase shifting stage 110 capable of providing either positive or negative 90 degree phase shifts may be constructed from only four phase shifting circuit elements and three switches, allowing for a compact and efficient solution.

The set of switches 112 may comprise any number of switches, and switches of the set of switches 112 may be any suitable components capable of selectively coupling the sub-circuits 111 to circuit common rails, grounds, and/or circuit inputs/outputs. For example, switches may include mechanical switches, mechanical relays, solid-state relays, transistors, silicon controlled rectifiers, triacs, and/or digital switches Switches of the set of switches 112 are preferably set electronically by the tuning circuit 130, but may additionally or alternatively be set in any manner. For example, the set of switches 112 may include switches manually set by a circuit user.

Figure 6A:
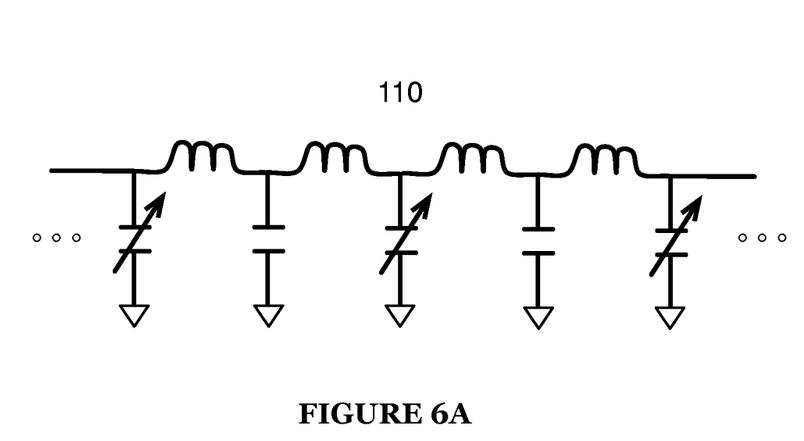
FIG. 6A is a schematic representation of a primary phase shifting stage of a system of a preferred embodiment.
Figure 7:
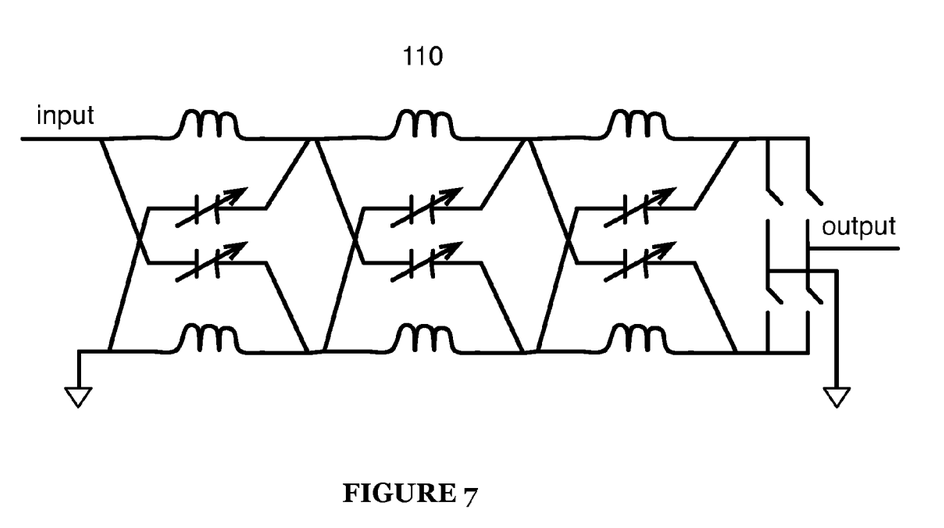
FIG. 7 is a schematic representation of a primary phase shifting stage of a system of a preferred embodiment.

Some additional examples of primary phase shifting stage 110 architecture are as shown in FIGS. 6A and 7.

Figure 6B:
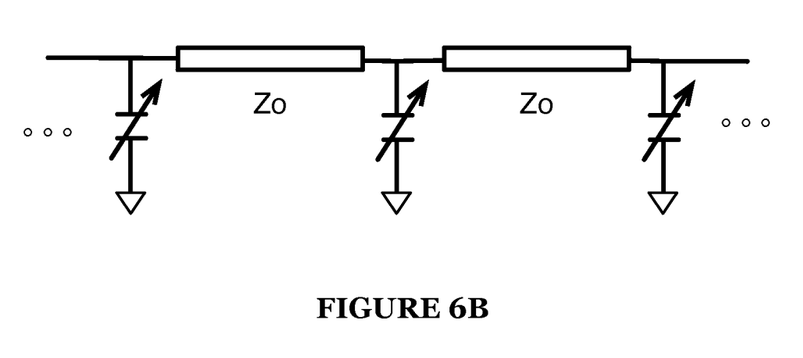
FIG. 6B is an equivalent circuit schematic representation of a primary phase shifting stage of a system of a preferred embodiment.

As shown in FIG. 6A, the primary phase shifting stage 110 may comprise an LC ladder circuit; note that capacitors (or inductors) of the stage 110 may be tunable. In this example, the circuit may be modeled as a network of transmission lines having a characteristic impedance Zo with variable shunt capacitances, as shown in FIG. 6B. By appropriately setting inductor and capacitor values, such a circuit could serve as a series of +60 degree phase shifters at a particular impedance; in the case of a 4-inductor circuit as shown in FIG. 6A, resulting in +120 degrees of phase shift. Note that the primary phase shifting stage 110 may include any number of sub-circuits (e.g., in this case, multiples of 60 degrees of phase shift). By tuning the variable shunt capacitances, the impedance of the circuit may be changed to optimize phase shift performance (discussed in more detail in later sections).

Another example phase shifting stage 110 is as shown in FIG. 7 (note the presence of switches and sub-circuits, similar to those of a previously described implementation).

The primary phase shifting stage 110 may include an impedance matching network (alternatively referred to as an impedance transformer) at its input and output that compensates for variations in the primary phase shifting stage 110 input and output impedance (and/or phase shift amount) due to changes in signal component frequency. The primary phase shifting stage 110 may additionally include such an impedance matching network in order to transform the impedance of the stage to and from a suitable impedance level for the core of the phase shifter (e.g., 50 ohms). Alternatively, the primary phase shifting stage 110 may not include impedance matching networks. The impedance matching networks are preferably tunable (e.g., continuously or discretely variable) but may additionally or alternatively be static (i.e., the impedance transformation achieved by using the network is not variable).

As previously discussed, the secondary phase shifting stage 120 is preferably substantially similar to the primary phase shifting stage 110, except in that the secondary phase shifting stage 120 has higher phase shifting resolution than the primary phase shifting stage 110.

The system 100 preferably includes multiple phase shifting stages 110 and 120; these phase shifting stages preferably may be switched 'on' (e.g., in signal path) or 'off' (e.g., bypassed, out of signal path), depending on control signals. The resulting phase shift is determined by which stages are on and which stages are off; for example, a system 100 with a 90 degree primary phase shifting stage 110 and a 10 degree secondary phase shifting stage 'on' might cause a shift of 100 degrees in signal phase.

Each phase shifting stage 110 and 120 preferably causes a set amount (i.e., non-variable amount) of phase shift. Alternatively, phase shifting stages may include tunable phase-shift elements. For example, a phase shifting stage may include a varactor; by changing a control voltage of the varactor, the varactor's capacitance (and thus the amount of phase shift experienced by a signal passing through the stage) may be varied. Alternatively, a similar effect may be accomplished through use of digitally tunable capacitors (DTCs).

Figure 8:
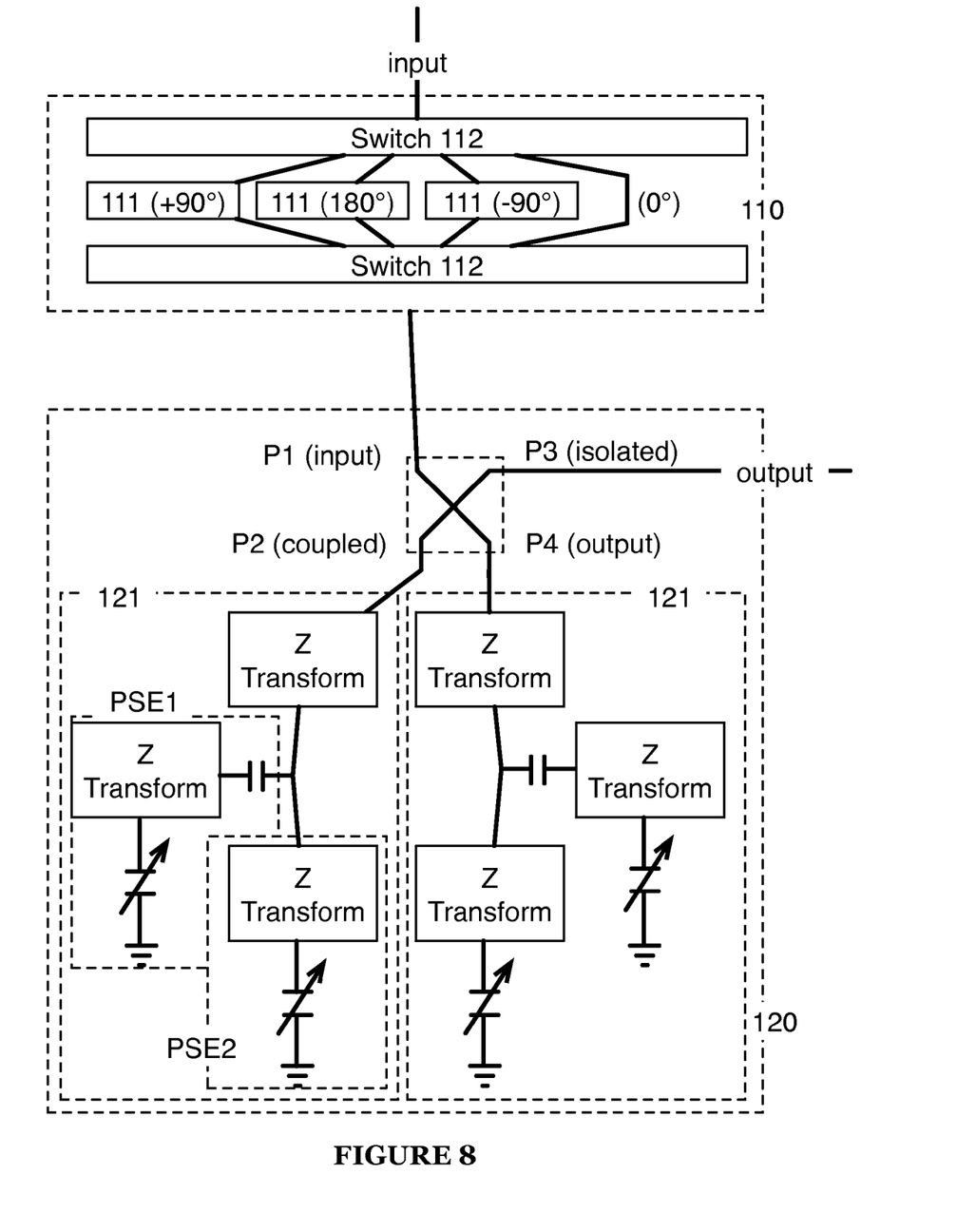
FIG. 8 is a schematic representation of a system of a preferred embodiment.

An example of a system 100 incorporating multiple phase shifting stages 110 and 120 is as shown in FIG. 8. In this example, the primary phase shifting stage 110 includes a set of sub-circuits 111 selectable (via switches 112; e.g., via tandem single-pole four-throw switches) to perform quadrant shifting. The sub-circuits 111 preferably comprise passive phase shifting networks (e.g., as previously described) but may additionally or alternatively comprise any suitable phase shifting circuits.

In this example, the system 100 also includes a secondary phase shifting stage 120. The secondary phase shifting stage 120 preferably includes a hybrid coupler; the input of the phase shifting stage 120 is coupled to the input port (e.g., P1 as shown in FIG. 8) of the hybrid coupler, while the output of the phase shifting stage 120 is coupled to the isolated port of the hybrid coupler (e.g., P3 as shown in FIG. 8). Likewise, two phase shifting sub-circuits 121 are coupled to the coupled and output (e.g., P2 and P4) ports of the hybrid coupler respectively. The hybrid coupler enables signals incident upon the input port to be reflected by the two sub-circuits 121 into the stage output (i.e., the isolated port of the hybrid coupler). Based on the architecture and impedance of the sub-circuits 121, the reflected signal experiences a phase shift.

In this example, each sub-circuit 121 preferably includes a primary impedance transformer (coupled to the hybrid coupler), a first phase shifting element (PSE1 coupled to the primary impedance transform), and a second phase shifting element (PSE2 coupled to the primary impedance transform). Additionally or alternatively, each sub-circuit 121 may include any number of phase shifting elements. Each phase shifting element preferably includes an impedance transformer coupled to ground via a variable capacitor (e.g., a DTC); additionally, phase shifting elements may include additional circuit elements. For example, one PSE may include a capacitor coupling the PSE Z transform to the primary Z transform; this capacitor may serve to modify the phase shifting resolution of the phase shifting element (e.g., the capacitance may be selected such that PSE1 results in finer shifts to phase than PSE2 for the same DTC control values).

Figure 9:
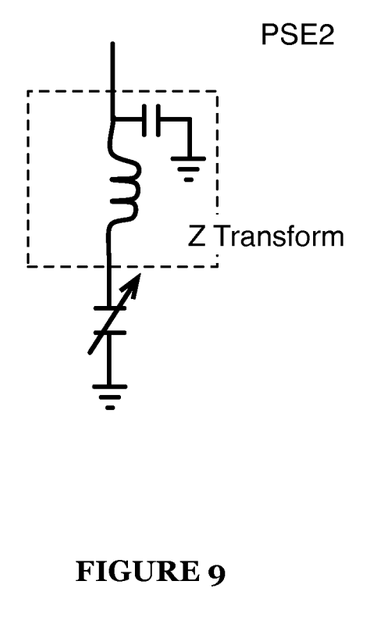
FIG. 9 is a schematic representation of a phase shifting element of a system of a preferred embodiment.

In one implementation, the impedance transformers are LC circuits as shown in FIG. 9 (given in the example of the Z transform of the PSE2 as shown in FIG. 8); additionally or alternatively, the impedance transformers may be any suitable system capable of impedance transformation.

The two sub-circuits 121 are preferably impedance matched in order to maximize the power reflected to the isolated output of the hybrid coupler; additionally or alternatively, the two sub-circuits 121 may be any suitable sub-circuits with any impedance values.

The tuning circuit 130 functions to control configuration parameters of the primary and secondary phase shifting stages 110 and 120 in response to a desired phase shift. Configuration parameters preferably include DTC values and switch settings, but may additionally or alternatively include any other suitable configuration parameters (e.g., variable impedance matching network tunings, attenuation settings, etc.).

The tuning circuit 130 preferably sets the configuration states of phase shifting stages 110/120 in response to a desired phase shift value at an output of the system 100, but may additionally or alternatively set configuration states based on any suitable information (e.g., input signal characteristics or environmental data). In general, the tuning circuit 130 (in concert with attenuators/amplifiers) may enable the adaptation of any complex weight to a signal.

The tuning circuit 130 preferably adapts system 100 parameters according to a combination of expected outcomes and actual outcomes (e.g., a lookup table containing initial values for circuit elements may serve as an initial configuration setting for a particular phase shift output, after which point circuit elements may be iteratively tuned in order to more accurately reach a particular phase shift output). Additionally or alternatively, the tuning circuit 130 may adapt system 100 parameters in any manner.

The tuning circuit 130 may adapt configuration states and/or configuration state generating/choosing algorithms using analytical methods, online gradient-descent methods (e.g., LMS, RLMS), and/or any other suitable methods.

The tuning circuit 130 is preferably implemented as a programmable digital circuit, but may additionally or alternatively be implemented in any suitable digital or analog circuit, including implementation as software in a general purpose computing device.

In addition to controlling phase shift parameters of individual stages, the tuning circuit 130 may also control how phase shift stages 110/120 are coupled into a signal path. Phase shifting stages 110 and 120 are preferably configured to be used with a hybrid thermometer encoding scheme. The hybrid thermometer encoding scheme is preferably a hybrid of binary and thermometer encoding schemes; in one implementation of a preferred embodiment, binary encoding is used for large phase shift values, while thermometer encoding is used for smaller values.

The encoding scheme specifies how phase shifting stages 110/120 are to be switched on and off to achieve particular phase shift values. For example, a four-stage binary encoded phase shifting system 100 might be configured to have 16 phase shift values: 0000 (0 degree shift), 0001 (2 degree shift), 0010 (4 degree shift) . . . 1111 (32 degree shift). In contrast, a four-stage thermometer encoded phase shifting system 100 might be configured to have five phase shift values: 0000 (0 degree shift), 0001 (2 degree shift), 0011 (4 degree shift), 0111 (6 degree shift), 1111 (8 degree shift). A hybrid thermometer encoded scheme combines attributes of the binary scheme and the thermometer scheme; for example, a hybrid thermometer scheme might include several stages with large phase change effects that are switched according to a binary scheme, while stages with smaller phase change effects may be switched according to a thermometer scheme. This prevents stages from being cycled (i.e., switched on and off) unnecessarily for small changes in phase shift and preserves monotonicity during phase shifter operation (an important aspect of the thermometer encoding that is not present in the binary encoding). In this way, a phase shifting system 100 utilizing hybrid thermometer encoding can preserve desirable aspects of thermometer coding (e.g., monotonicity, which results in a smaller lookup table and fewer iterations for the algorithm) while reducing the overall number of stages needed to perform phase shifting.

As discussed previously, the system 100 may find use within systems for self-interference cancellation. In one implementation, the system 100 may serve as the phase shifters described in U.S. Provisional Application No. 62/240,835, the entirety of which is incorporated by this reference. As described in the reference, phase shifters are used by the analog self-interference canceller to transform input signal components (in combination with attenuation/gain by scalers); the phase-shifted and scaled components may then be combined to form a self-interference cancellation signal.

Figure 10:
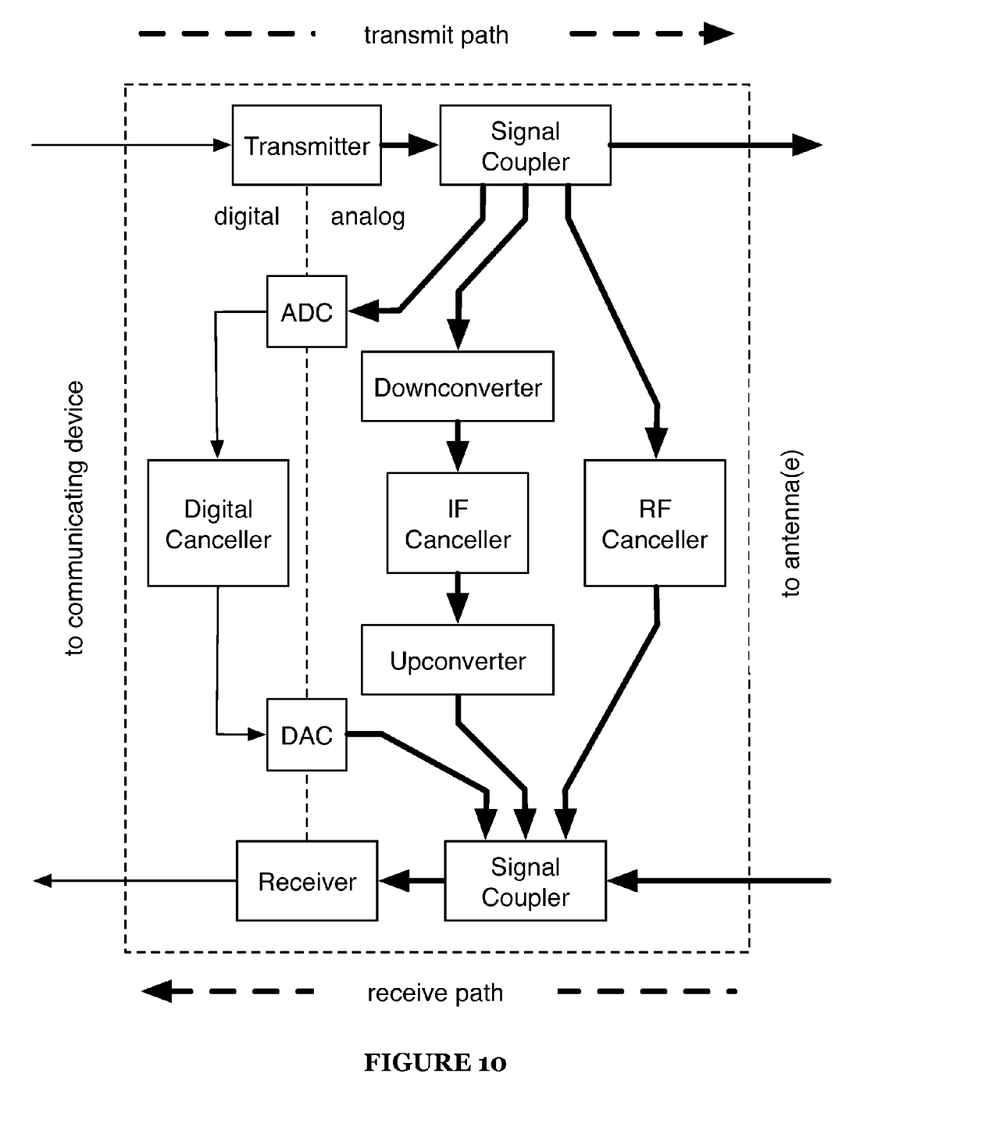
FIG. 10 is a schematic representation of a self-interference cancellation system integrated with a full-duplex transceiver.

The system 100 may also be used in another manner as part of systems for self-interference cancellation. In many cases, self-interference cancellation systems include intermediate frequency (IF) and/or analog-sourced digital self-interference cancellers (as shown in FIG. 10 and described in U.S. patent application Ser. No. 14/569,354, the entirety of which is incorporated by this reference). In order to couple to RF receive and transmit signals, the RF signals must be converted in frequency (to baseband or to an intermediate frequency). In the example as shown in FIG. 10, frequency downconversion is accomplished by the ADC and the downcoverter for the digital canceller and IF canceller respectively; frequency upconversion is accomplished by the DAC and the upconverter for the digital canceller and the IF canceller respectively.

In both cases, frequency conversion is preferably performed using heterodyning methods utilizing a mixer and a local oscillator (LO); the local oscillator functions to provide a frequency shift signal to the mixer; the mixer combines the frequency shift signal and an input signal to create frequency shifted signals.

For IF/analog-sourced digital self-interference cancellation signals to be effective, the signals need to be phase-matched (e.g., at 0 or 180 degrees relative to) to the signal in which interference cancellation is desired (e.g., the incoming receive signal of a transceiver). In general, this is accomplished by phase shifters implemented in the signal path (e.g., as discussed in the analog self-interference canceller, although such phase shifters may be external to the actual cancellation circuitry.

Figure 11:
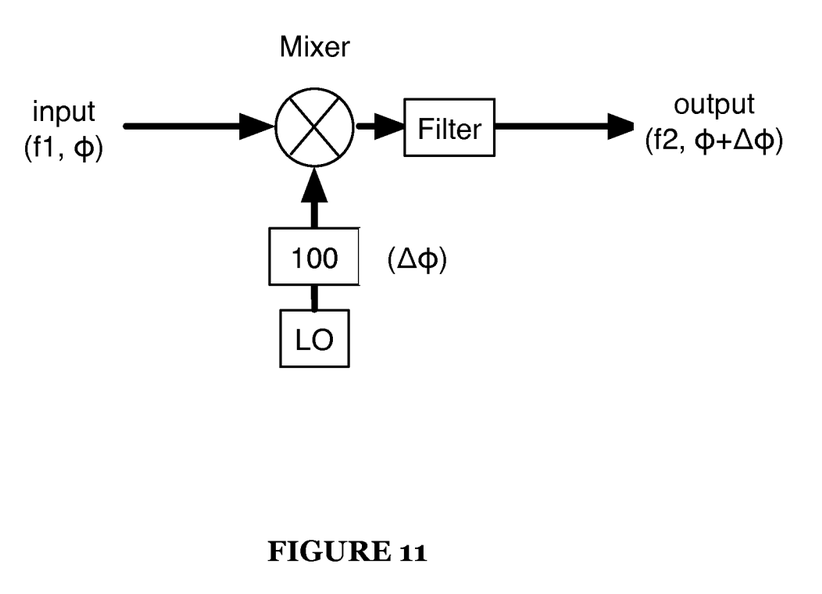
FIG. 11 is an example schematic representation of integration of a system of a preferred embodiment with a local oscillator.

In one embodiment, the system 100 is coupled to one or more local oscillators of a self-interference cancellation system, such that the system 100 provides phase shifting for the local oscillator signal (which in turn provides phase shifting to signals being frequency converted based on that LO signal) as shown in FIG. 11. This results in no insertion loss for the signal being phase shifted; further, since the LO signal is generally a continuous wave tone, the system 100 may be operated at very low power without sacrificing linearity.

As a person skilled in the art will recognize from the previous detailed description and from the figures and claims, modifications and changes can be made to the preferred embodiments of the invention without departing from the scope of this invention defined in the following claims.

We claim:
1. A system for phase shifting comprising:
a first switch that couples a first switch input to a common rail only when the first switch is closed;
a first sub-circuit, comprising a first capacitor and a first inductor; wherein the first inductor couples a signal input of the system to the first switch; wherein the first capacitor couples the first switch input and the first inductor to the common rail; wherein the first sub-circuit includes only a single inductor and a single capacitor;
a second switch that couples a second switch input to the common rail only when the second switch is closed;
a second sub-circuit, comprising a second capacitor and a second inductor; wherein the second capacitor couples the signal input of the system to the second switch; wherein the second inductor couples the second switch input and the second capacitor to the common rail; wherein the second sub-circuit includes only a single inductor and a single capacitor; and
a third switch that couples a signal output of the system to the first sub-circuit when in a first switch state and couples the output of the system to the second sub-circuit when in a second switch state;
wherein the system phase shifts the signal output relative to the signal input.

2. The system of claim 1, wherein the first switch is open, the second switch is closed, the third switch is in the first switch state, and the system shifts the signal output by positive ninety degrees relative to the signal input.

3. The system of claim 2, wherein the signal input is coupled to a local oscillator of a self-interference canceller; wherein the signal output is coupled to a mixer of the self-interference canceller; wherein the system produces a phase-shifted version of a signal of the local oscillator for use by the mixer.

4. The system of claim 1, wherein the first switch is closed, the second switch is open, the third switch is in the second switch state, and the system shifts the signal output by negative ninety degrees relative to the signal input.

5. A system for phase shifting that produces an output signal by modifying a phase of an input signal, the system comprising:
a primary phase shifting stage that modifies the input signal phase in increments set by a first tuning resolution;
a secondary phase shifting stage that modifies the input signal phase in increments set by a second tuning resolution, wherein the secondary phase shifting stage comprises:
a first secondary sub-circuit comprising a first impedance transformer, a first phase shifting element and a second phase shifting element;
a second secondary sub-circuit comprising a second impedance transformer, a third phase shifting element and a fourth phase shifting element; and
a hybrid coupler, wherein an input port of the hybrid coupler is coupled to an input of the secondary phase shifting stage, wherein an isolated port of the hybrid coupler is coupled to an output of the secondary phase shifting stage, wherein a coupled port of the hybrid coupler is coupled to the first secondary sub-circuit; wherein an output port of the hybrid coupler is coupled to the second secondary sub-circuit; and
a tuning circuit that controls the primary phase shifting stage and the secondary phase shifting stage according to control input;
wherein the second tuning resolution is higher than the first tuning resolution.

6. The system of claim 5, wherein the primary phase shifting stage comprises an LC ladder network; wherein the ladder network comprises CLC Pi circuits coupled by shunt digitally tunable capacitors.

7. The system of claim 5, wherein the primary phase shifting stage comprises an LC ladder network; wherein the ladder network comprises CLC Pi circuits coupled by shunt varactors.

8. The system of claim 5, wherein the primary phase shifting stage comprises an impedance matching network; wherein the secondary phase shifting stage comprises an impedance matching network.

9. The system of claim 5, wherein each of the first phase shifting element, the second phase shifting element, the third phase shifting element, and the fourth phase shifting element comprise a varactor.

10. The system of claim 5, wherein each of the first phase shifting element, the second phase shifting element, the third phase shifting element, and the fourth phase shifting element comprise a digitally tunable capacitor.

11. The system of claim 10, wherein the first and third phase shifting elements each comprise a capacitor that reduces change in contribution of the first and third phase shifting elements to overall system phase shifting relative to change in contribution of the second and fourth phase shifting elements in response to an identical change in digitally tunable capacitance settings.

12. The system of claim 11, wherein the primary phase shifting stage comprises a first primary sub-circuit, a second primary sub-circuit, a third primary sub-circuit, and a set of switches that selectively couples an input of the primary phase shifting stage to an output of the primary phase shifting stage via the first primary sub-circuit, the second primary sub-circuit, the third primary sub-circuit, or a sub-circuit bypass according to a switch state of the set of switches; wherein the first primary sub-circuit provides a positive ninety degree phase shift; wherein the second primary sub-circuit provides a one hundred eighty degree phase shift; wherein the third primary sub-circuit provides a negative ninety degree phase shift; wherein the sub-circuit bypass provides zero degrees of phase shift.

13. The system of claim 5, wherein the primary phase shifting stage comprises a first primary sub-circuit, a second primary sub-circuit, a third primary sub-circuit, and a set of switches that selectively couples an input of the primary phase shifting stage to an output of the primary phase shifting stage via the first primary sub-circuit, the second primary sub-circuit, the third primary sub-circuit, or a sub-circuit bypass according to a switch state of the set of switches; wherein the first primary sub-circuit provides a positive ninety degree phase shift; wherein the second primary sub-circuit provides a one hundred eighty degree phase shift; wherein the third primary sub-circuit provides a negative ninety degree phase shift; wherein the sub-circuit bypass provides zero degrees of phase shift.

14. A system for self-interference cancellation comprising:
a transmit coupler, communicatively coupled to an RF transmit signal of a wireless communication system, that samples the RF transmit signal to create a sampled RF transmit signal having a first RF carrier frequency;
a frequency downconverter that converts the sampled RF transmit signal to an IF transmit signal having an IF carrier frequency, wherein the IF carrier frequency is less than the first RF carrier frequency;
an IF self-interference canceller that transforms the IF transmit signal to an IF self-interference cancellation signal;
a frequency upconverter, comprising a first mixer, a first local oscillator, and a first phase shifter, that converts the IF self-interference cancellation signal to a phase-shifted IF-sourced RF self-interference cancellation signal by phase shifting a signal of the first local oscillator and mixing the phase shifted local oscillator signal with the IF self-interference cancellation signal;

an RF self-interference canceller that transforms the sampled RF transmit signal to an RF self-interference cancellation signal; and a receive coupler, communicatively coupled to an RF receive signal of the wireless communication system, that combines the RF self-interference cancellation signal and the phase-shifted IF-sourced RF self-interference cancellation signal with the RF receive signal.

15. The system of claim 14, wherein the phase shifter comprises a primary phase shifting stage that modifies the input signal phase in increments set by a first tuning resolution, and a secondary phase shifting stage that modifies the input signal phase in increments set by a second tuning resolution; wherein the second tuning resolution is higher than the first tuning resolution.

16. The system of claim 15, further comprising a digital self-interference canceller that transforms a digital transmit signal of the wireless communication system to a digital self-interference cancellation signal, and a digital-to-analog converter; wherein the digital-to-analog converter converts the digital self-interference cancellation signal to a digitally-sourced RF self-interference cancellation signal; wherein the receiver combines the RF self-interference cancellation signal, the IF-sourced RF self-interference cancellation signal, and the digitally-sourced RF self-interference cancellation signal with the RF receive signal.

17. The system of claim 16, wherein the digital-to-analog converter comprises a second mixer, a second local oscillator, and a second phase shifter, and converts the digital self-interference cancellation signal to a phase-shifted digitally-sourced RF self-interference cancellation signal by phase shifting a signal of the second local oscillator and mixing the phase shifted local oscillator signal with the digital self-interference cancellation signal.

18. The system of claim 17, wherein the first phase shifter comprises a digitally tuned capacitor; wherein parameters of the digitally tuned capacitor are controlled by a tuning circuit in response to received complex weights.

* * * * *